US010388617B2

(12) United States Patent
Kaltalioglu et al.

(10) Patent No.: US 10,388,617 B2
(45) Date of Patent: Aug. 20, 2019

(54) MECHANICALLY ANCHORED C4 PAD AND METHOD OF FORMING SAME

(71) Applicant: GLOBALFOUNDRIES INC., Grand Cayman (KY)

(72) Inventors: Erdem Kaltalioglu, Newburgh, NY (US); Ping-Chuan Wang, Hopewell Junction, NY (US); Ronald Gene Filippi, Jr., Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/793,130

(22) Filed: Oct. 25, 2017

(65) Prior Publication Data
US 2019/0123005 A1    Apr. 25, 2019

(51) Int. Cl.
| H01L 23/00 | (2006.01) |
| H01L 23/48 | (2006.01) |
| H01L 21/308 | (2006.01) |
| H01L 21/60 | (2006.01) |

(52) U.S. Cl.
CPC .......... *H01L 24/05* (2013.01); *H01L 21/3081* (2013.01); *H01L 23/481* (2013.01); *H01L 24/03* (2013.01); *H01L 24/08* (2013.01); *H01L 24/11* (2013.01); *H01L 24/13* (2013.01); *H01L 2021/60022* (2013.01); *H01L 2224/0556* (2013.01); *H01L 2224/05541* (2013.01)

(58) Field of Classification Search
CPC ......... H01L 24/03; H01L 24/05; H01L 24/08; H01L 24/11; H01L 27/14603; H01L 27/1462; H01L 27/1464
See application file for complete search history.

(56) References Cited

U.S. PATENT DOCUMENTS

| 2009/0283807 A1* | 11/2009 | Adkisson | ............... H01L 24/05 257/292 |
| 2009/0286346 A1* | 11/2009 | Adkisson | .......... H01L 27/14618 438/65 |

OTHER PUBLICATIONS

D. Borah et al., "Nanopatterning via Self-Assembly of a Lamellar-Forming Polystyrene-block-Poly(dimethylsiloxane) Diblock Copolymer on Topographical Substrates Fabricated by Nanoimprint Lithography," Nanomaterials 2018, 8 (32), www.mdpi.com/journal/nanomaterials, 11 pages.

* cited by examiner

*Primary Examiner* — Zandra V Smith
*Assistant Examiner* — John M Parker
(74) *Attorney, Agent, or Firm* — Anthony Canale; Hoffman Warnick LLC

(57) ABSTRACT

The present disclosure relates generally to flip chip technology and more particularly, to a method for fabricating a mechanically anchored controlled collapse chip connection (C4) pad on a semiconductor structure and a structure formed thereby. In an embodiment, a method is disclosed that includes forming a C4 pad on a patterned dielectric layer having grooves therein, the grooves providing an interfacial surface area between the patterned dielectric layer and the C4 pad sufficient to inhibit the C4 pad from delaminating during thermal expansion or contraction.

14 Claims, 19 Drawing Sheets

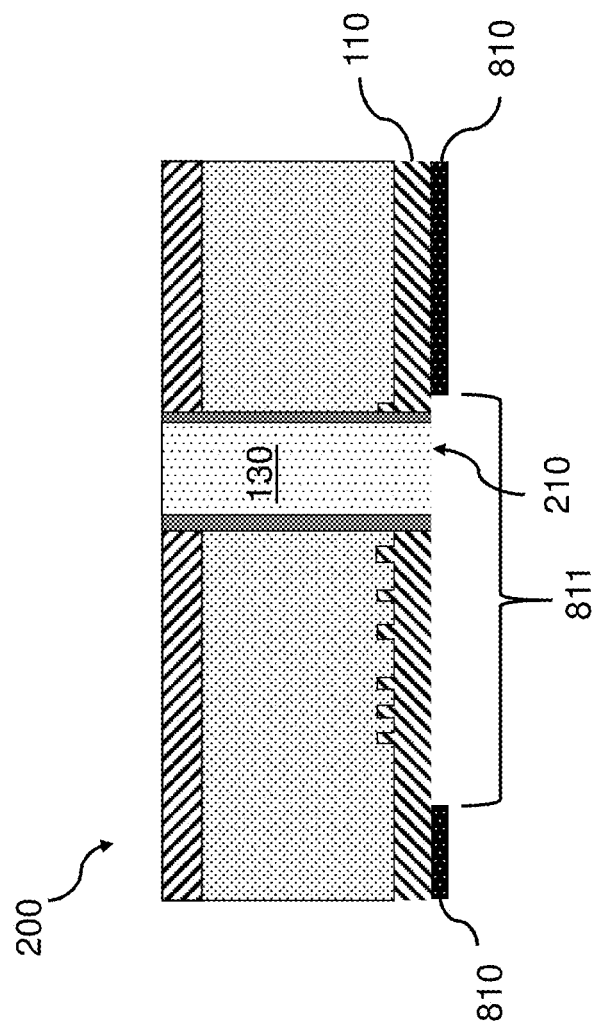

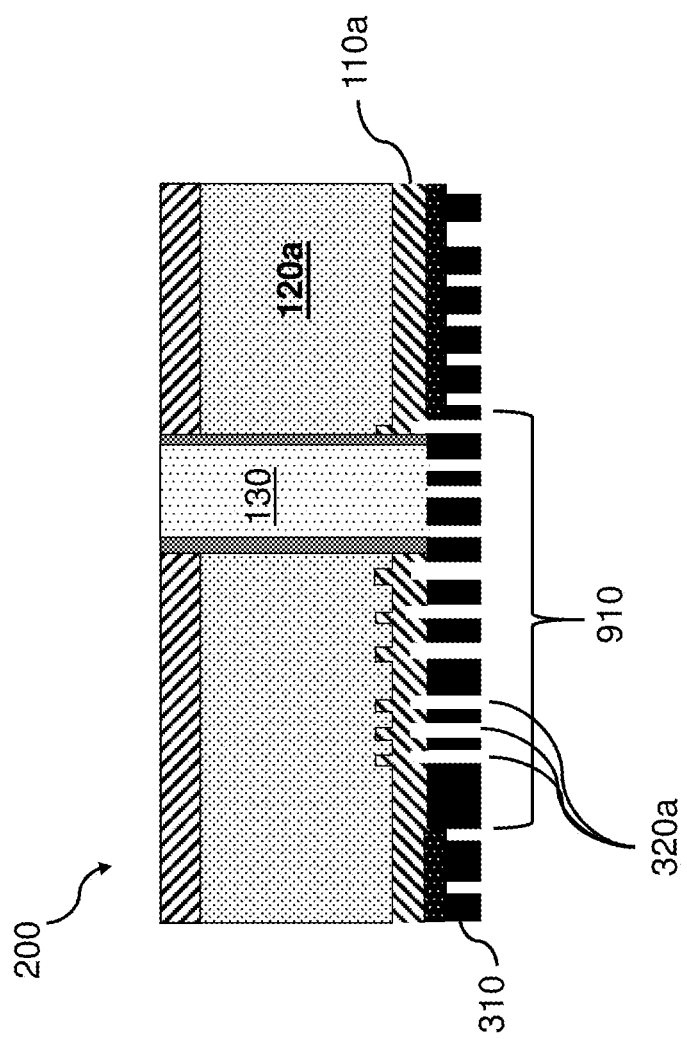

MECHANICALLY ANCHORED C4 PAD AND METHOD OF FORMING SAME

TECHNICAL FIELD

The subject matter disclosed herein relates generally to flip chip technology and more particularly, to a method for fabricating a mechanically anchored controlled collapse chip connection (C4) pad on a semiconductor structure and a structure formed thereby.

BACKGROUND

The packaging industry has adopted the widespread use of flip chip technology for high performance applications. In a typical flip chip package, a semiconductor die may be bumped with individual conducting pads over its entire area. These conducting pads may be connected to front side devices present on the same semiconductor die by, for example, through substrate vias (TSVs). The conducting pads on the semiconductor die may also be connected to corresponding conducting pads on a substrate (or, in a 2.5 D package, an interposer or, in a 3D package, another semiconductor die) using small solder balls, or bumps, such as controlled collapse chip connections (C4 connections). The conducting pads on the substrate may be connected to circuitry that routes the electrical signals to an array of conductors (ball grid arrays (BGA)), column grid arrays (CGA) or land grid arrays (LGA)) to electrically connect to a printed circuit board.

A bonding pad, for example a C4 pad, may be formed on a back side of a semiconductor wafer after the back side has been thinned to expose vias, for example TSVs. The C4/bonding pad may be formed by depositing a conductive material, typically a metal such as copper, over the exposed bottom surface of the TSV and the back side of the semiconductor wafer.

This technique of forming bonding pads may result in a substantially flat interface between the semiconductor wafer/TSV and the bonding pad. While the flat interface may provide a continuous connection between the TSV and the bonding pad, it may be subject to delamination and separation during fluctuations in temperature of the flip chip (e.g., post chip join cool down). Differences in the coefficients of thermal expansion of the materials that make up the semiconductor wafer, the TSV, and the bonding pad, as well as mechanical stresses resulting from chip stacking, may cause the bonding pad to separate from the semiconductor wafer and the TSV. This separation may cause problems with electrical connections and reliability in the flip chip.

BRIEF SUMMARY

Methods for fabricating a mechanically anchored C4 pad on a semiconductor structure are disclosed, as well as those structures fabricated thereby. In a first aspect of the disclosure, a method for fabricating a mechanically anchored C4 pad on a semiconductor structure includes: forming a dielectric layer on a backside of a semiconductor substrate having a via extending there through to a front side back end of line (BEOL) layer, the via having a conformal liner layer thereon; exposing a surface of the via by removing a portion of the dielectric layer and a portion of the conformal liner layer; forming a self-assembling block copolymer (BCP) layer on the dielectric layer and the surface of the via, the self-assembling BCP layer having a pattern of grooves therein, the grooves extending from a first surface of the self-assembling BCP layer to a second, opposing surface of the self-assembling BCP layer; patterning the dielectric layer by etching the dielectric layer using the self-assembling BCP layer having the pattern of grooves therein as a mask, the patterned dielectric layer having the pattern of grooves therein; removing the self-assembling BCP layer; and forming a controlled collapse chip connection (C4) pad by depositing a conductive material on the patterned dielectric layer and within the grooves of the patterned dielectric layer, the C4 pad being in direct electrical contact with the surface of the via.

A second aspect of the disclosure includes a method for fabricating a mechanically anchored C4 pad on a semiconductor structure, including: forming a self-assembling block copolymer (BCP) layer on a backside of a semiconductor substrate having a via extending there through to a front side back end of line (BEOL) layer, the via having a conformal liner layer thereon, the self-assembling BCP layer having a pattern of grooves therein, the grooves extending from a first surface of the self-assembling BCP layer to a second, opposing surface of the self-assembling BCP layer; patterning the semiconductor substrate by etching the semiconductor substrate using the self-assembling BCP layer having the pattern of grooves therein as a mask, the patterned semiconductor substrate having the pattern of grooves therein; removing the self-assembling BCP layer; forming a dielectric layer on the patterned semiconductor substrate by depositing a dielectric material on the patterned semiconductor substrate and within the grooves of the patterned semiconductor substrate; exposing a surface of the via by removing a portion of the dielectric layer and a portion of the conformal liner layer; and forming a controlled collapse chip connection (C4) pad by depositing a conductive material on the dielectric layer, the C4 pad being in direct electrical contact with the surface of the via.

A third aspect of the disclosure includes a mechanically anchored C4 pad on a semiconductor structure, including: a semiconductor substrate having a backside and a front side; a via extending from a back end of line (BEOL) layer on the front side of the semiconductor substrate and through the semiconductor substrate, the via having a conformal liner layer on sidewalls thereof; a dielectric layer on the backside of the semiconductor substrate, the via having a surface thereof exposed through the dielectric layer; and a controlled collapse chip connection (C4) pad on the dielectric layer, the C4 pad being in direct electrical contact with the surface of the via; wherein at least one of: a) the semiconductor substrate has a pattern of grooves therein at an interface of the semiconductor substrate and the dielectric layer, and b) the dielectric layer has a pattern of grooves therein at an interface of the dielectric layer and the C4 pad.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 18 is a cross section view of structure 200 and illustrates optional hardmasking of the dielectric layer, after partial patterning of the substrate.

FIG. 19 is a cross section view of structure 200 and illustrates optional partial patterning of the dielectric layer, after partial patterning of the substrate.

Figure 1:
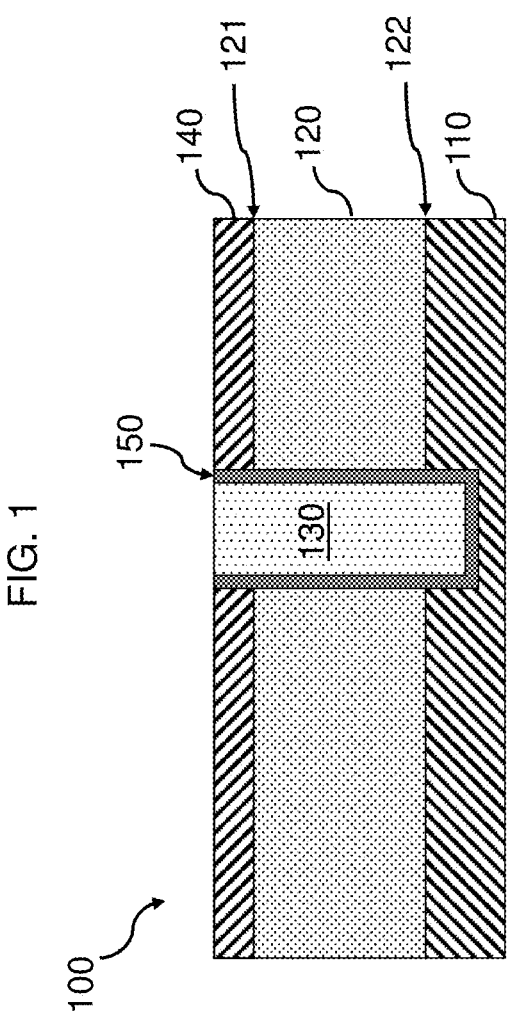
FIG. 1 is a cross section view of a structure 100 and illustrates an initial formation of a via containing semiconductor substrate having a dielectric layer formed on the backside thereof.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. The subject matter of this disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

In the interest of not obscuring the presentation of embodiments of the present disclosure, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present disclosure.

The present disclosure relates generally to flip chip technology and more particularly, to a method for fabricating a mechanically anchored controlled collapse chip connection (C4) pad on a semiconductor structure and structures fabricated thereby. As mentioned above, bonding pads can suffer from separation from the semiconductor wafer and the TSV. One way to reduce this separation is to mechanically anchor the bonding pad into the semiconductor wafer. Embodiments wherein the bonding pad is anchored to the semiconductor wafer are described below and with reference to the Figures.

Since flip chips are "flipped over" after their final processing step in order to mount to other components/devices, the Figures herein depict flip chip structures in their "flipped over" orientation. Accordingly, when techniques mentioned herein, such as layer depositing, are depicted in the Figures, it appears as though the layer has been deposited on a bottom surface.

FIG. 1 is a cross section view of a structure 100 and illustrates forming a dielectric layer 110 on a backside 122 of a semiconductor substrate 120. Dielectric layer 110 can be composed of any dielectric material, such as, for instance silicon nitride, silicon carbide, boron nitride, silicon boron nitride, silicon boron nitride carbon, silicon carbon nitride, carbon boron nitride, aluminum oxide, aluminum nitride, and carbon doped silicon nitride. Dielectric layer 110 can be formed by any known technique, for example, depositing.

As used herein, "depositing" (or "deposition") may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As used herein, "electroplating" refers to a process of plating one metal onto another by hydrolysis and may include mass plating (also barrel plating), rack plating, continuous plating, and line plating.

Semiconductor substrate 120 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B11, and B2 are relative proportions each greater than or equal to zero and A1+A2+B1+B2=1 (1 being a total mole quantity).

Substrate 120 may have a via 130 extending there through to a front side 121 back end of line (BEOL) layer 140. Via 130 can be any known via, including a through substrate via (TSV). For ease of illustration, the figures herein depict a TSV as via 130. Via 130 can be composed of a conductive material, for instance, copper, tungsten, alloys thereof, or other metallic materials of sufficiently low resistivity. Via 130 can be positioned anywhere along a top surface of a C4 pad (later described) and can be in-line with or horizontally offset from a C4 bump (later described). Via 130 can be formed by any known technique, such as, for example, patterned etching, and depositing or electroplating.

Via 130 may have a conformal liner layer 150 thereon. Conformal liner layer 150 can be composed of any insulating material, for instance silicon oxide and/or silicon nitride. Conformal liner layer can have any desired thickness such that liner layer 150 acts as a diffusion barrier to prevent the conductive material of via structure 130 from migrating into substrate 120. Liner layer 150 may be formed by any conventional deposition technique known in the art.

Figure 2:
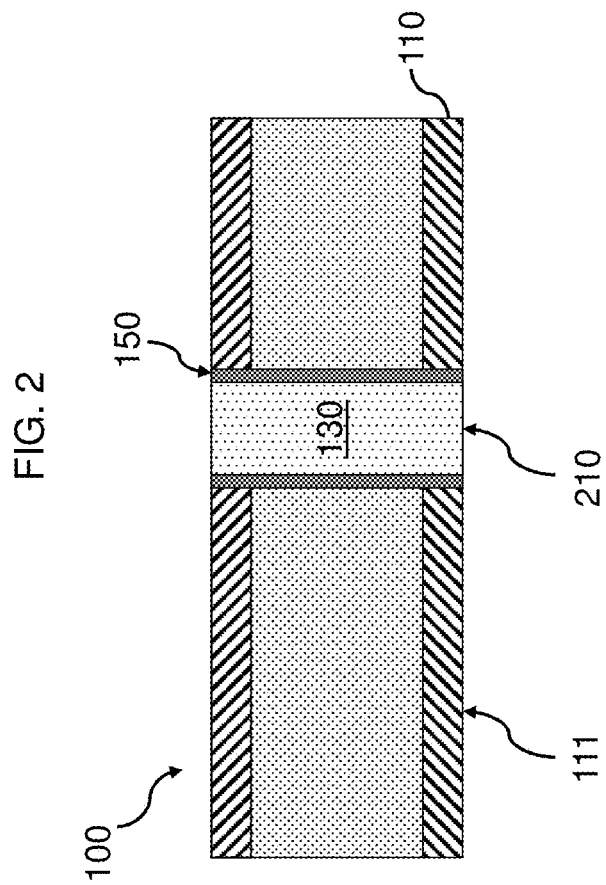
FIG. 2 is a cross section view of structure 100 and illustrates exposing a surface of the via.

FIG. 2 is a cross section view of structure 100 and illustrates exposing a surface 210 of via 130 by removing a portion of dielectric layer 110 and a portion of liner layer 150. A conventional non-selective removal technique, such as chemical mechanical polishing (CMP), may be used to remove the portion of dielectric layer 110 and the portion of liner layer 150. Alternatively, via 130 can be exposed by a reactive ion etching (RIE) process. Regardless of technique, it is desired to have surface 210 substantially flush with a surface 111 of the remaining dielectric layer 110.

Figure 3:
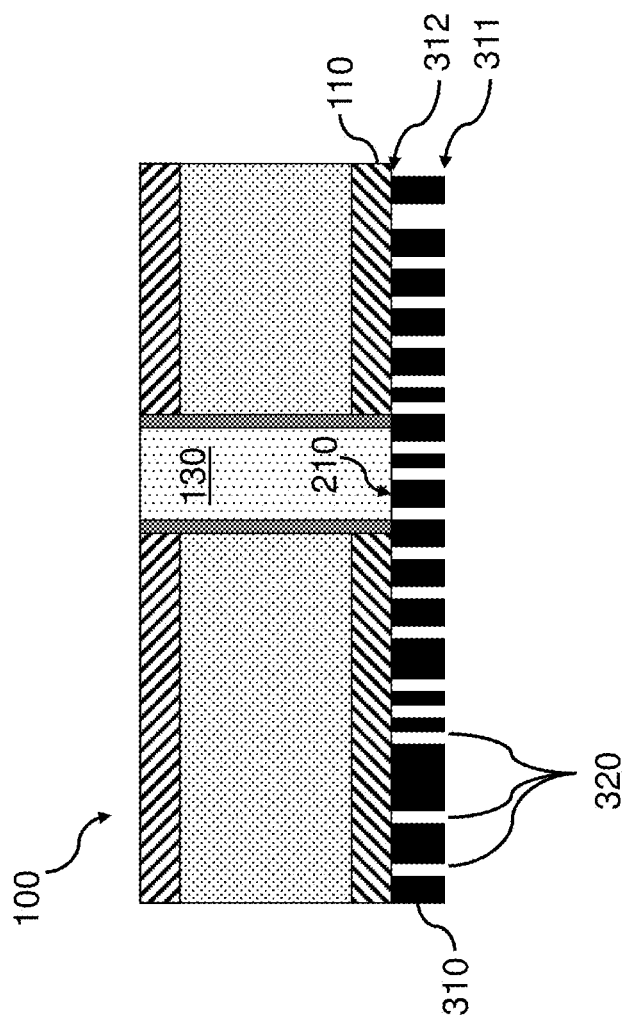
FIG. 3 is a cross section view of structure 100 and illustrates the formation of a self-assembling block copolymer (BCP) layer having a pattern of grooves therein.

FIG. 3 is a cross section view of structure 100 and illustrates forming a self-assembling block copolymer (BCP) layer 310 on dielectric layer 110 and surface 210 of via 130. Self-assembling BCP layer 310 has a pattern of grooves 320 therein, grooves 320 extending from a first surface 311 of self-assembling BCP layer 310 to a second, opposing surface 312 of self-assembling BCP layer 310.

Self-assembling block copolymers are composed of block copolymers which comprise two or more homopolymer subunits linked by covalent bonds. The union of the homopolymer subunits may include an intermediate non-repeating subunit known as a junction block. Block copolymers with two or three distinct blocks are called diblock copolymers and triblock copolymers, respectively. Self-assembly is a phenomenon where components of a system assemble themselves to form a larger functional unit. Directed self-assembly is a directed type of self-assembly which utilizes block copolymer morphology to create controlled (or ordered) feature shapes such as, for example, lines or ordered patterns. Undirected self-assembly is an undirected type of self-assembly that is spontaneous and uncontrolled and typically results in random feature shapes such as, for example, a fingerprint-like pattern. The spaces between the noted feature shapes correspond to the above-mentioned grooves 320.

Grooves 320 can have any varying or unvarying width and/or depth. Grooves 320 can form a random pattern (undirected self-assembly) or an ordered pattern (directed self-assembly). The number of grooves 320 can vary from 1 upward. If, for example, only one groove 320 is present in self-assembling BCP layer 310, it is desirable for groove 320 to wind throughout layer 310 similar to, for instance, a random fingerprint pattern, resulting in what appears to be multiple grooves 320 when layer 310 is viewed in cross-section.

Figure 4:
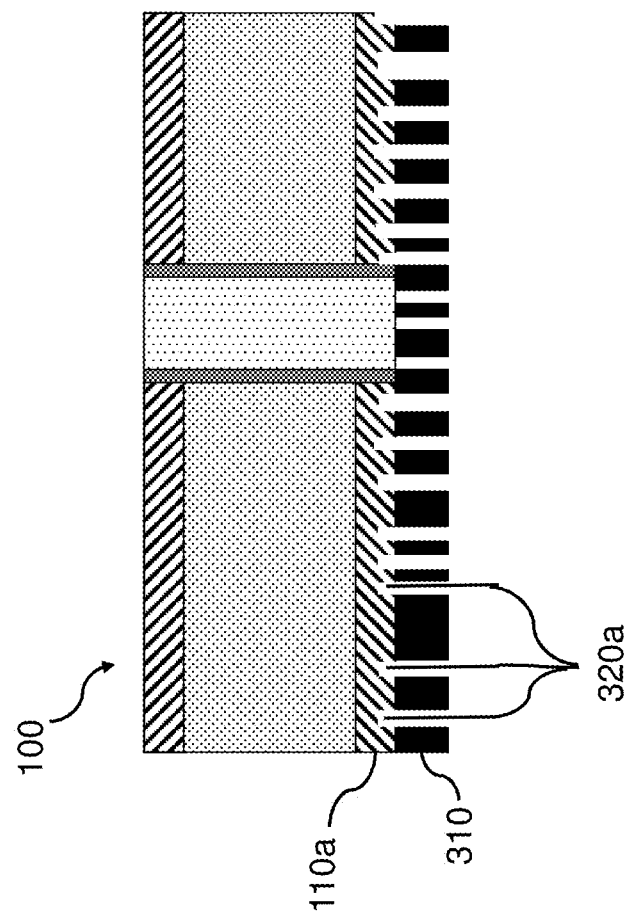
FIG. 4 is a cross section view of structure 100 and illustrates patterning of the dielectric layer.

FIG. 4 is a cross section view of structure 100 and illustrates patterning dielectric layer 110 by etching dielectric layer 110 using self-assembling BCP layer 310 having the pattern of grooves 320 therein as a mask, thereby forming a patterned dielectric layer 110a having a pattern of grooves 320a therein. Grooves 320a extend partially into dielectric layer 110a. The depth of grooves 320a may vary but need to be deep enough to provide an interfacial surface area between patterned dielectric layer 110a and a C4 pad (discussed below) sufficient to inhibit the C4 pad from delaminating during thermal expansion or contraction.

As used herein, "patterning" typically refers to lithography followed by etching. In "lithography" (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example. In the instant disclosure, the self-assembling BCP layer acts as the patterned resist which also serves as a mask.

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches or deep, narrow grooves.

Figure 5:
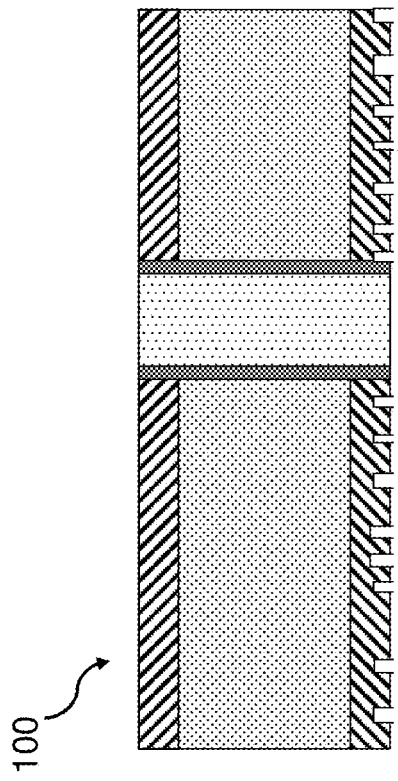
FIG. 5 is a cross section view of structure 100 and illustrates removal of the self-assembling BCP layer.

FIG. 5 is a cross section view of structure 100 and illustrates the removal of self-assembling BCP layer 310 (see FIG. 4). Any conventional removal technique may be used to remove self-assembling BCP layer 310 such as but not limited to selected ozonation.

Figure 6:
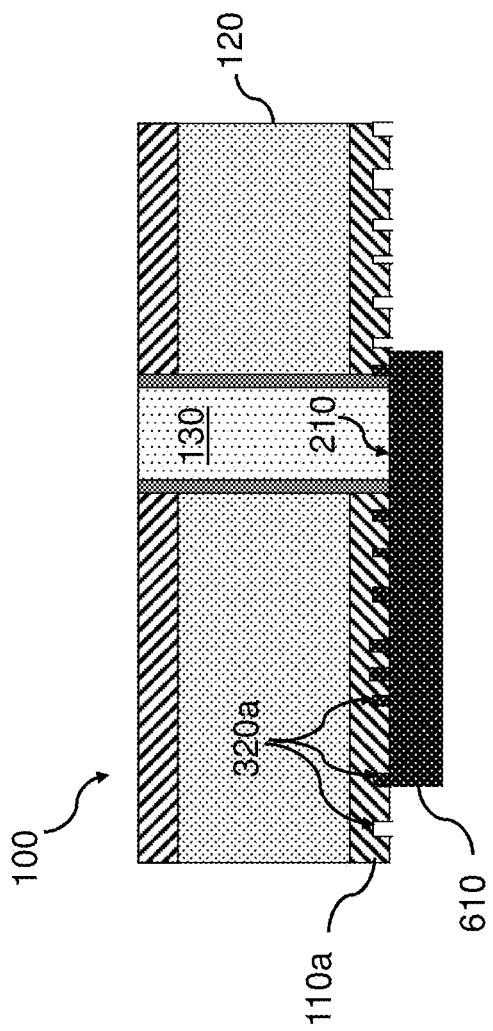
FIG. 6 is a cross section view of structure 100 and illustrates the formation of a controlled collapse chip connection (C4) pad.

FIG. 6 is a cross section view of structure 100 and illustrates forming a controlled collapse chip connection (C4) pad 610 by depositing a conductive material on patterned dielectric layer 110*a* and within grooves 320*a* of patterned dielectric layer 110*a*. C4 pad 610 is in direct electrical contact with surface 210 of via 130. C4/bonding pad 610 may be formed by any conventional method of forming solder connections known in the art, such as evaporation, plating, stencil printing, paste screening, molten solder injection, and electroplate soldering. C4/bonding pad 610 may be composed of a conductive material such as, but not limited to, chromium, copper, aluminum, nickel, and alloys thereof. C4/bonding pad 610 may be formed so that the conductive material fills grooves 320*a*, thereby anchoring C4/bonding pad 610 in place. In other words, C4/bonding pad 610 may have a coplanar side opposite substrate 120 and a non-coplanar side in contact with substrate 120.

Figure 7:
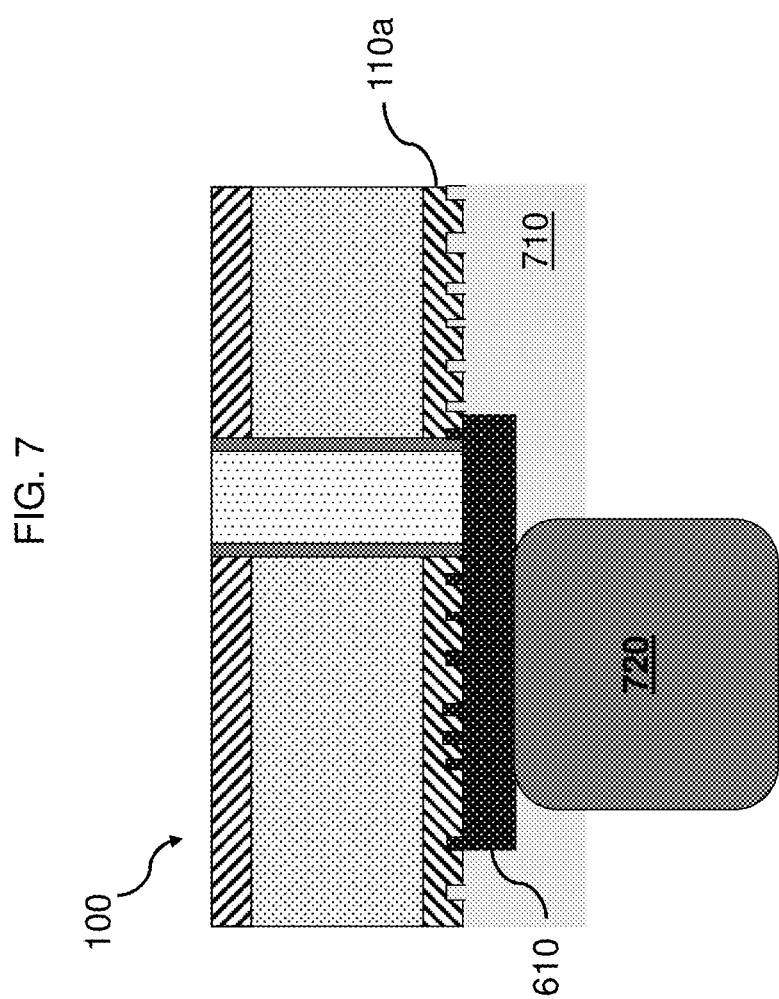
FIG. 7 is a cross section view of structure 100 and illustrates the formation of a buffer layer and a C4 bump.

FIG. 7 is a cross section view of structure 100 and illustrates forming a buffer layer 710 adjacent to and on a portion of C4 pad 610 (a "first portion"), and forming a C4 bump 720 on another portion of C4 pad 610 (a "second portion"). Buffer layer 710 may be composed of an organic material, such as for example a photosensitive polyimide (PSPI), polybenzoxazole (PBO), or a combination thereof. Buffer layer 710 may serve to mitigate mechanical stresses caused by any coefficient of thermal expansion mismatch between C4 bump 720 and C4/bonding pad 720 and substrate 120. Buffer layer 710 may be formed by any conventional deposition and etching techniques. C4 bump 720 may be composed of at least one material, such as a lead-free alloy (e.g., gold, a tin/silver/copper alloy, or other lead-free alloys), a lead-containing alloy (e.g., a lead/tin alloy), copper, aluminum, a conductive polymer, other conductive metals, and combinations thereof. C4 bump 720 may be formed by any conventional method of forming solder bumps known in the art, such as evaporation, plating, stencil printing, paste screening, molten solder injection, and electroplate soldering.

Figure 8:
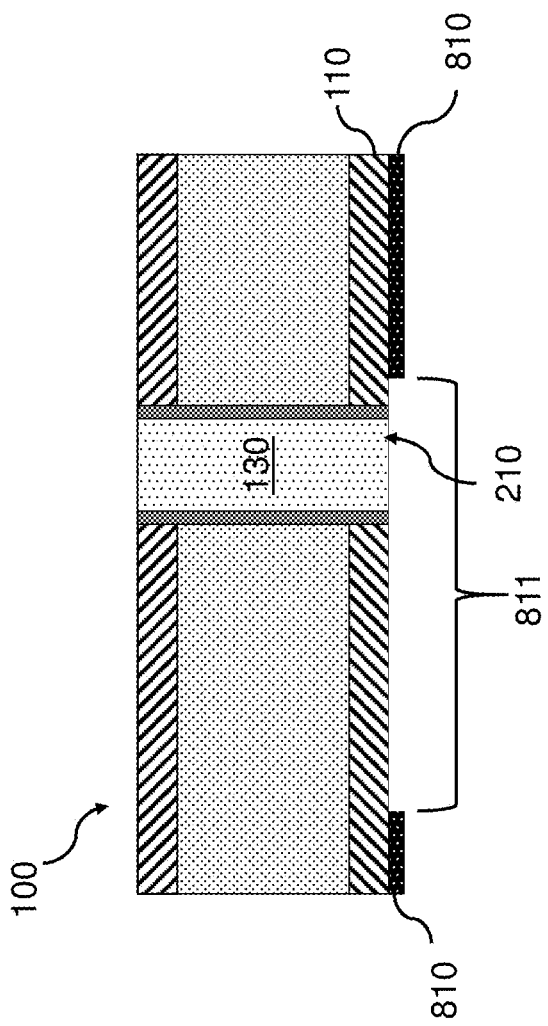
FIG. 8 is a cross section view of structure 100 and illustrates optional hardmasking of the dielectric layer.

As shown in FIG. 8, the method of the disclosure for forming structure 100 can optionally comprise, after the exposing of surface 210 of via 130 (e.g., FIG. 2) but before the forming of self-assembling BCP layer 310 (e.g., FIG. 3), depositing a hardmask 810 on dielectric layer 110 and creating one or more hardmask openings 811 (one opening 811 shown) by selectively removing one or more portions of hardmask 810.

Figure 9:
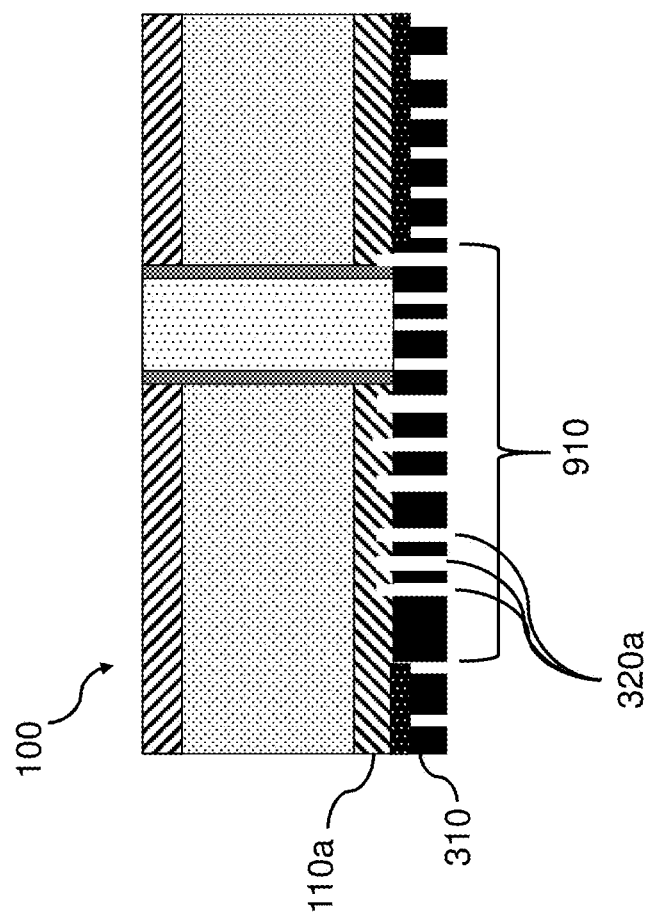
FIG. 9 is a cross section view of structure 100 and illustrates optional partial patterning of the dielectric layer.

FIG. 9 depicts a resulting patterned dielectric layer 110*a* that has grooves 320*a* in an area 910. Area 910 is defined by hardmask opening(s) 811 (see FIG. 8). As previously described, layer 310 is self-assembling BCP layer 310. The difference in structure 100 due to these optional features as shown in FIG. 9, as compared to FIG. 4 not having these optional features, is a reduced surface area of patterned dielectric layer 110*a* for grooves 320*a* (see area 910 which does not span entire width of patterned dielectric layer 110*a*).

The above discussed FIGS. 1-9 relate to embodiments where dielectric layer 110 is patterned. The following figures, FIGS. 10-19, relate to embodiments where substrate 120 is additionally patterned.

Figure 10:
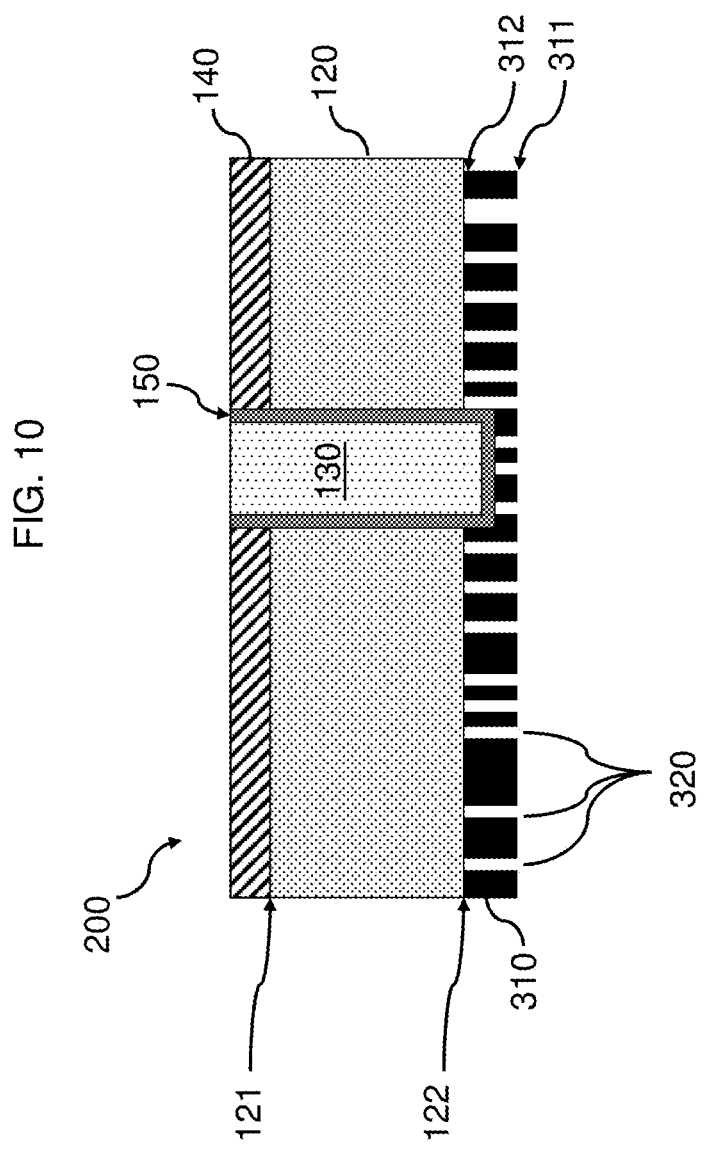
FIG. 10 is a cross section view of a structure 200 and illustrates an initial formation of a via containing semiconductor substrate having a self-assembling block copolymer (BCP) layer formed on the backside thereof, the self-assembling BCP layer having a pattern of grooves therein.

FIG. 10 is a cross section view of a structure 200 and illustrates forming a self-assembling block copolymer (BCP) layer 310 on a backside 122 of a semiconductor substrate 120 having a via 130 extending there through to a front side 121 back end of line (BEOL) layer 140. Via 130 may include a conformal liner layer 150 thereon. Self-assembling BCP layer 310 has a pattern of grooves 320 therein, grooves 320 extending from a first surface 311 of self-assembling BCP layer 310 to a second, opposing surface 312 of self-assembling BCP layer 310. Details of these components of structure 200 and their formation can be found in the above discussion of FIG. 1 and FIG. 3. A difference between structure 200 of FIG. 10 and structure 100 of FIG. 3 is that structure 200 does not have intervening dielectric layer 110 between substrate 120 and self-assembling BCP layer 310.

Figure 11:
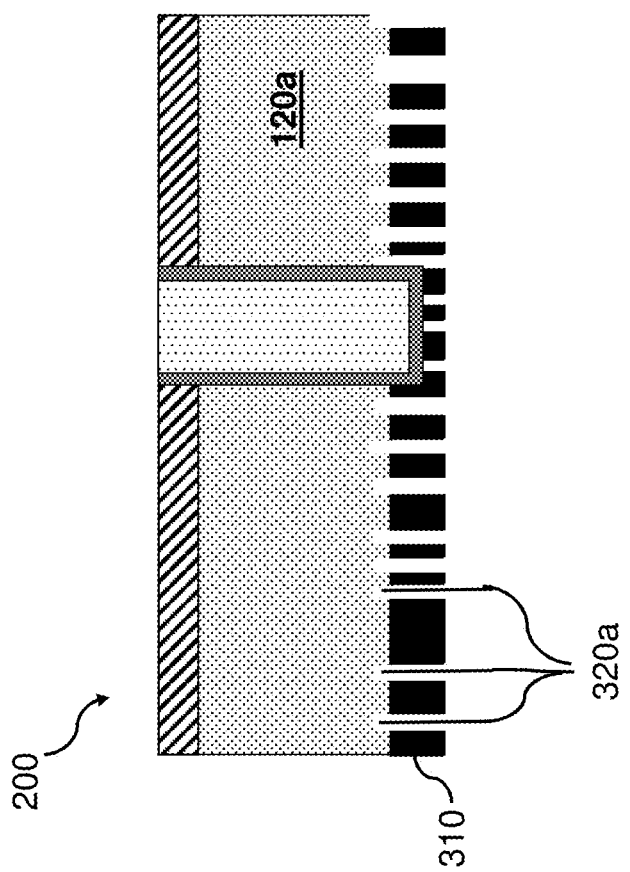
FIG. 11 is a cross section view of structure 200 and illustrates patterning of the semiconductor substrate.

FIG. 11 is a cross section view of structure 200 and illustrates patterning semiconductor substrate 120 by etching semiconductor substrate 120 using self-assembling BCP layer 310 having the pattern of grooves 320 therein as a mask. Patterned semiconductor substrate 120*a* has a pattern of grooves 320*a* therein as a result. Details of using self-assembling BCP layer 310 as a mask for patterning/etching an adjacent layer can be found in the above discussion of FIG. 4.

Figure 12:
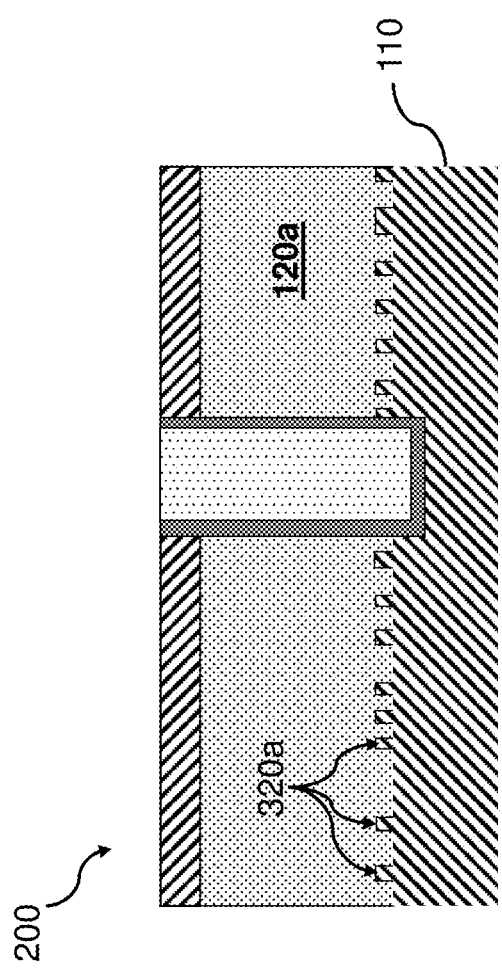
FIG. 12 is a cross section view of structure 200 and illustrates the removal of the self-assembling BCP layer and the formation of a dielectric layer.

FIG. 12 is a cross section view of structure 200 and illustrates removing self-assembling BCP layer 310 and forming a dielectric layer 110 on patterned semiconductor substrate 120*a* by depositing a dielectric material on patterned semiconductor substrate 120*a* and within grooves 320*a* of patterned semiconductor substrate 120*a*. Details of self-assembling BCP layer 310 removal and dielectric layer 110 formation can be found in the above discussion of FIG. 1 and FIG. 5.

Figure 13:
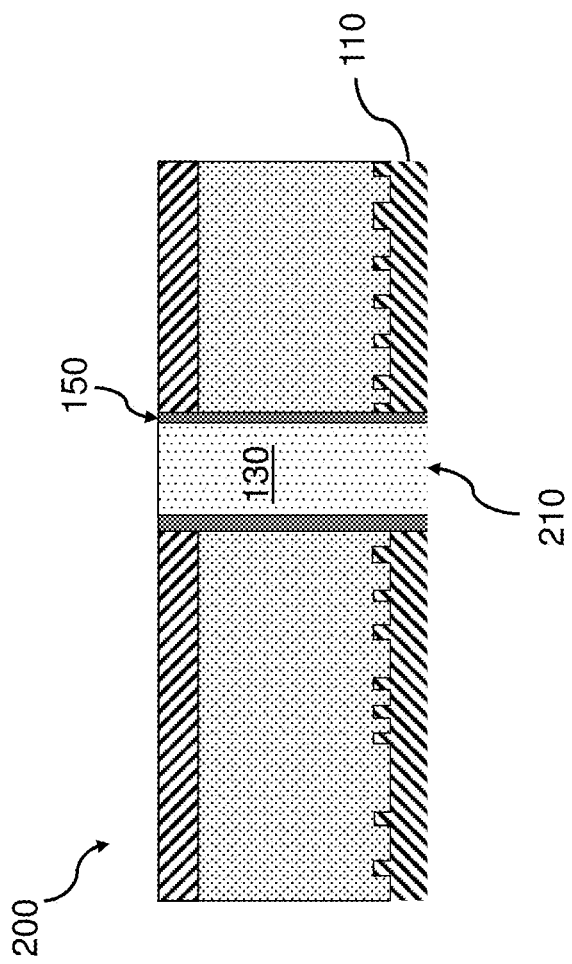
FIG. 13 is a cross section view of structure 200 and illustrates exposing a surface of the via.

FIG. 13 is a cross section view of structure 200 and illustrates exposing a surface 210 of via 130 by removing a portion of dielectric layer 110 and a portion of conformal liner layer 150. Details of dielectric layer 110 removal can be found in the above discussion of FIG. 2.

Figure 14:
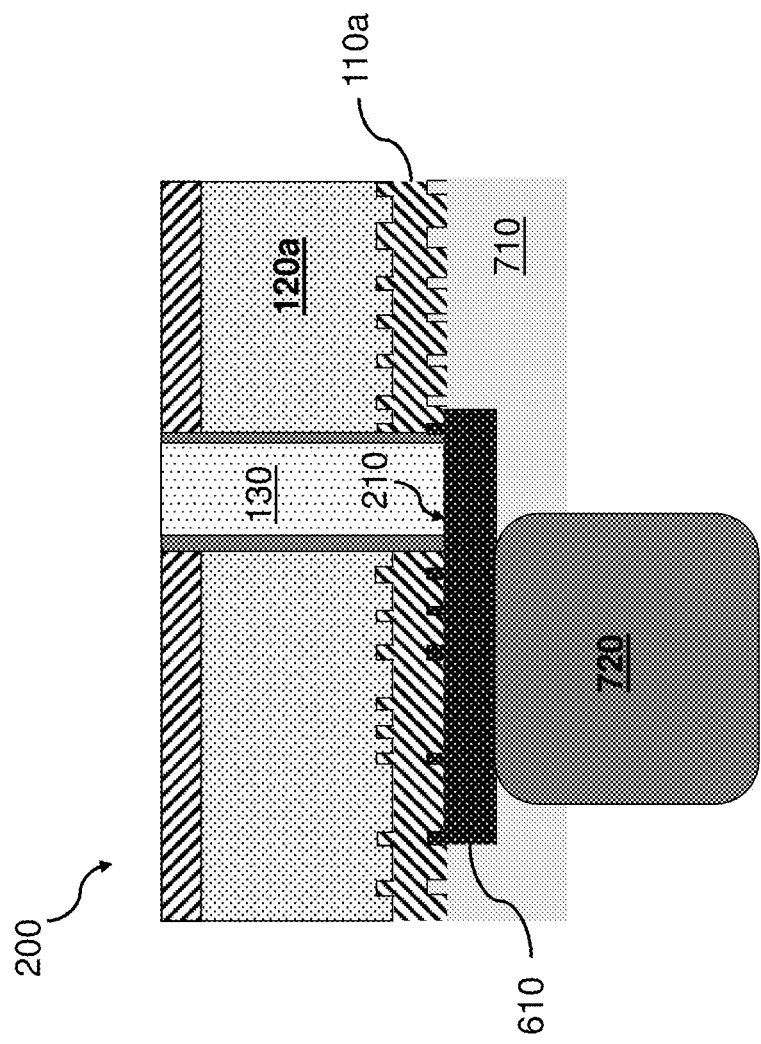
FIG. 14 is a cross section view of structure 200 and illustrates formation of a controlled collapse chip connection (C4) pad, a buffer layer and a C4 bump.

FIG. 14 is a cross section view of structure 200 and illustrates forming a controlled collapse chip connection (C4) pad 610 by depositing a conductive material on dielectric layer 110. C4 pad 610 is in direct electrical contact with surface 210 of via 130. FIG. 14 also illustrates additional steps of the method of the disclosure, including forming a buffer layer 710 adjacent to and on a portion of C4 pad 610 (a "first portion"), and forming a C4 bump 720 on another portion of C4 pad 610 (a "second portion"). Details of C4 pad 610, buffer layer 710 and C4 bump 720 and their formation can be found in the above discussion of FIG. 6 and FIG. 7.

As also shown in FIG. 14, the method of the disclosure for forming structure 200 can additionally, but optionally, include, between the exposing of surface 210 of via 130 and the forming of C4 pad 610: forming a self-assembling block copolymer (BCP) layer 310 on dielectric layer 110 and surface 210 of via 130. Self-assembling BCP layer 310 has a pattern of grooves 320 therein, grooves 320 extending from a first surface 311 of self-assembling BCP layer 310 to a second, opposing surface 312 of self-assembling BCP layer 310. See FIG. 3. Also shown is the result of patterning dielectric layer 110 by etching dielectric layer 110 using self-assembling BCP layer 310 having the pattern of grooves 320 therein as a mask. Patterned dielectric layer 110*a* therefore has a pattern of grooves 320*a* therein. See FIG. 4. Also shown is the result of removing self-assembling BCP layer 310. See FIG. 5. Further details of these additional optional features and formation thereof can be found in the above discussion of FIG. 3, FIG. 4 and FIG. 5.

Figure 15:
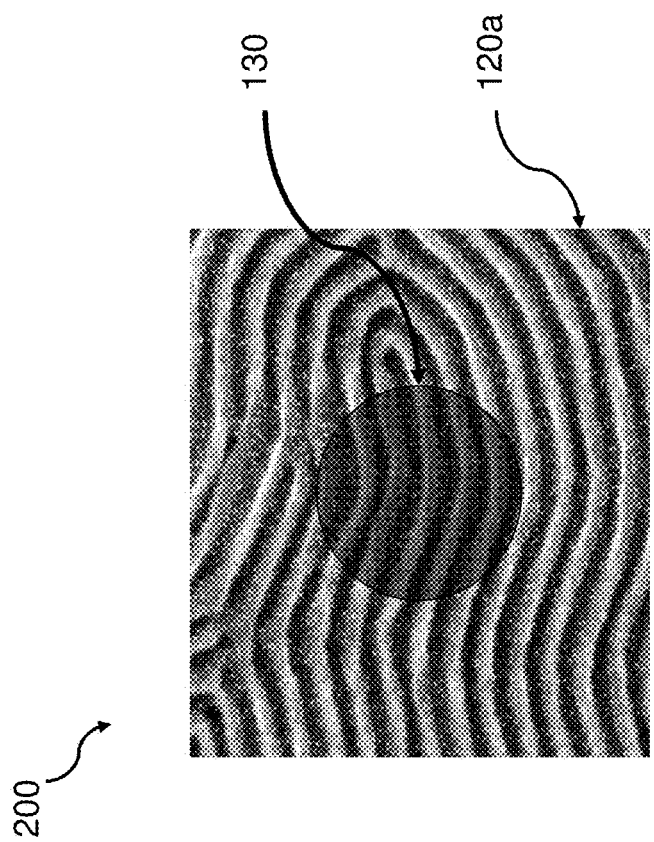
FIG. 15 is a top down view of structure 200 and illustrates a random pattern of grooves in the patterned semiconductor substrate.

FIG. 15 is a top down view of structure 200 and illustrates patterned semiconductor substrate 120*a* below via 130. The pattern depicted in FIG. 15 shows a random pattern of grooves; however, the pattern can alternatively be an ordered pattern of grooves.

Figure 16:
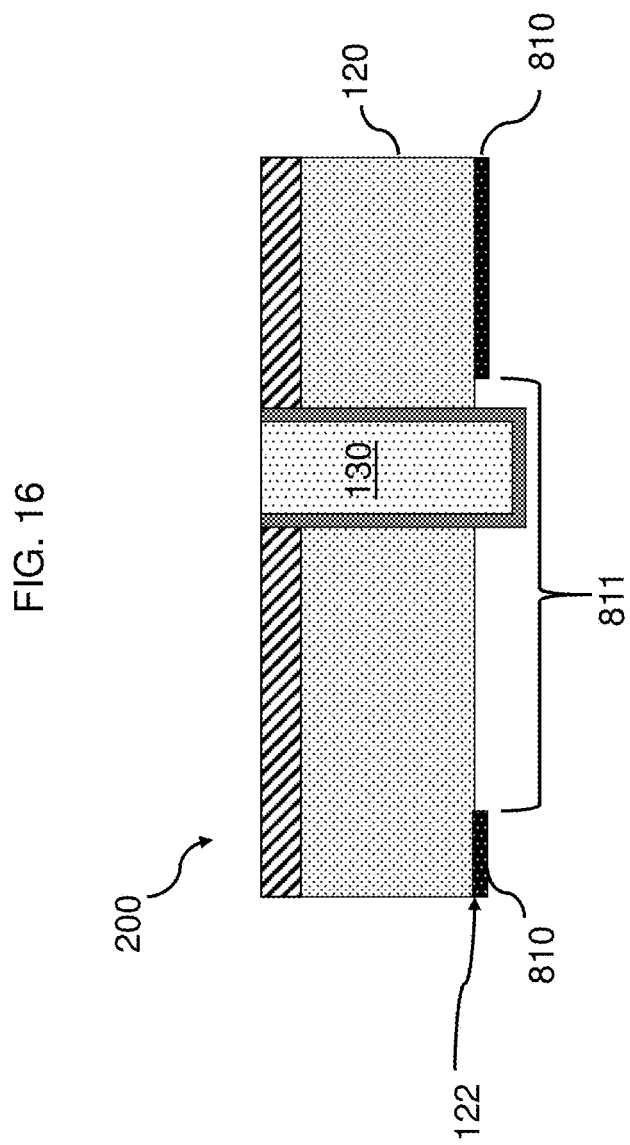
FIG. 16 is a cross section view of structure 200 and illustrates optional hardmasking of the substrate.

As shown in FIG. 16, the method of the disclosure for forming structure 200 can optionally comprise, before the forming of self-assembling BCP layer 310, depositing a hardmask 810 on backside 122 of substrate 120 and creating one or more hardmask openings 811 (one opening 811 shown) by selectively removing one or more portions of hardmask 810.

Figure 17:
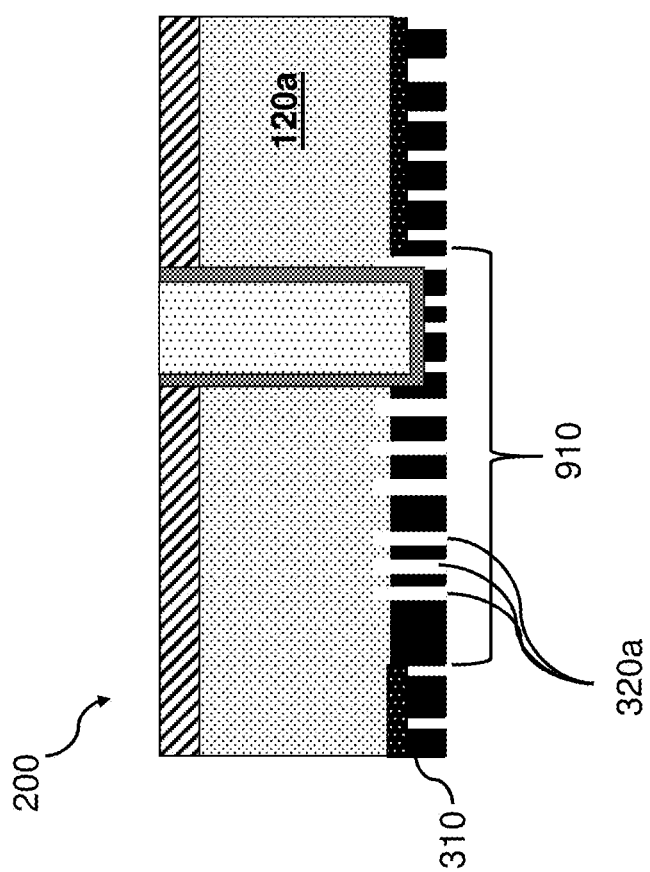
FIG. 17 is a cross section view of structure 200 and illustrates optional partial patterning of the substrate.

FIG. 17 depicts a resulting patterned substrate 120a that has grooves 320a in an area 910. Area 910 is defined by hardmask opening(s) 811 (see FIG. 16). As previously described, layer 310 is self-assembling BCP layer 310. The difference in structure 200 due to these optional features as shown in FIG. 17, as compared to FIG. 11 not having these optional features, is a reduced surface area of patterned substrate 120a for grooves 320a (see area 910 which does not span entire width of patterned substrate 120a).

As shown in FIG. 18, the method of the disclosure for forming structure 200 can further optionally comprise, after the exposing of surface 210 of via 130 (like that shown in FIG. 2 for structure 100) but before the forming of self-assembling BCP layer 310 (like that shown in FIG. 3 for structure 100): depositing a hardmask 810 on dielectric layer 110 and creating one or more hardmask openings 811 (one opening 811 shown) by selectively removing one or more portions of hardmask 810.

FIG. 19 depicts a resulting patterned dielectric layer 110a that has grooves 320a in an area 910. Area 910 is defined by hardmask opening(s) 811 (see FIG. 18). While the groove pattern/placement in substrate 120a and dielectric layer 110a are the same in FIG. 19, this need not be the case. The difference in structure 200 due to these optional features as shown in FIG. 19, as compared to FIG. 14 not having these optional features, is a reduced surface area of patterned dielectric layer 110a for grooves 320a as well as a reduced surface area of patterned substrate 120a (see area 910 which does not span entire width of patterned dielectric layer 110a or patterned substrate 120a).

As mentioned at the outset of this disclosure, the disclosure also relates to a structure formed by the above discussed methods. More specifically, and with respect to FIGS. 1-19 already discussed above, a structure of the disclosure comprises: a semiconductor substrate 120 having a backside 122 and a front side 121 and having a via 130 extending therethrough to a back end of line (BEOL) layer 140 on front side 121 of semiconductor substrate 120. Via 130 can have a conformal liner layer 150 on sidewalls thereof. A dielectric layer 110 can be present on backside 122 of semiconductor substrate 120. Via 130 can have a surface 210 thereof exposed through dielectric layer 110. A controlled collapse chip connection (C4) pad 610 may be present on dielectric layer 110. C4 pad 610 may be in direct electrical contact with surface 210 of via 130. The structure of the disclosure may be configured such that at least one of the following is satisfied: (a) semiconductor substrate 120 has a pattern of grooves 320 therein at an interface of substrate 120 and dielectric layer 110, and (b) dielectric layer 110 has a pattern of grooves 320 therein at an interface of dielectric layer 110 and C4 pad 610.

Multiple embodiments of the structure of the disclosure are included herein. For instance, structure 100 of FIG. 7 depicts an embodiment wherein dielectric layer 110a has grooves therein, whereas structure 200 of FIG. 14 depicts an embodiment wherein both dielectric layer 110a and semiconductor substrate 120a have grooves therein.

Furthermore, and referring back to the optional hardmasking of the semiconductor substrate and/or the dielectric layer discussed above with respect to the methods of the disclosure, it is noted that the structure of the disclosure can have a pattern of grooves on portion(s) of the noted layers rather than the entirety of the layers (see e.g., FIG. 9 and FIG. 19). More specifically, the pattern of grooves in the semiconductor substrate can be at one or more portions, but not the entirety, of the interface of the semiconductor substrate and the dielectric layer, and/or the pattern of grooves in the dielectric layer can be at one or more portions, but not the entirety, of the interface of the dielectric layer and the C4 pad.

In other words, in one embodiment, the structure may include grooves in the dielectric layer (but not the semiconductor substrate) and may include such grooves over the entire interface of the dielectric layer and the C4 pad (no hardmasking). In another embodiment, the structure may include grooves in the dielectric layer (but not the semiconductor substrate) and may include such grooves at one or more portions of the interface of the dielectric layer and the C4 pad (some hardmasking). In yet another embodiment, the structure may include grooves in both the dielectric layer and the semiconductor substrate, the grooves in both layers being over the entirety of each respective interface. In an additional embodiment, the structure may include grooves in both the dielectric layer and the semiconductor substrate, the grooves in both layers being at one or more portions of each respective interface. In another embodiment, the structure may include grooves in both the dielectric layer and the semiconductor substrate, the grooves in the dielectric layer being over the entirety of the interface of the dielectric layer and the C4 pad and the grooves in the substrate being at one or more portions of the interface of the substrate and the dielectric layer. In yet another embodiment, the structure may include grooves in both the dielectric layer and the semiconductor substrate, the grooves in the dielectric layer being at one or more portions of the interface of the dielectric layer and the C4 pad and the grooves in the substrate being over the entirety of the interface of the substrate and the dielectric layer.

When the pattern of grooves in the dielectric layer covers the entirety of the surface of the dielectric layer, the pattern of grooves is not only at an interface of the dielectric layer and the C4 pad but also at the interface of the dielectric layer and the buffer layer. This can be seen in both FIG. 7 and FIG. 14.

An advantage of the structures of the disclosure is that the pattern of grooves in the dielectric layer provides an interfacial surface area between the dielectric layer and the C4 pad sufficient to inhibit the C4 pad from delaminating during thermal expansion or contraction, thereby maintaining the electrical contact between the C4 pad and the via structure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method comprising:
   forming a dielectric layer on a backside of a semiconductor substrate having a via extending there through to a front side back end of line (BEOL) layer, the via having a conformal liner layer thereon;
   exposing a surface of the via by removing a portion of the dielectric layer and a portion of the conformal liner layer;
   forming a self-assembling block copolymer (BCP) layer on the dielectric layer and the surface of the via, the self-assembling BCP layer having a pattern of grooves therein, the grooves extending from a first surface of the self-assembling BCP layer to a second, opposing surface of the self-assembling BCP layer;
   patterning the dielectric layer by etching the dielectric layer using the self-assembling BCP layer having the pattern of grooves therein as a mask, the patterned dielectric layer having the pattern of grooves therein;
   removing the self-assembling BCP layer; and
   forming a controlled collapse chip connection (C4) pad by depositing a conductive material on the patterned dielectric layer and within the grooves of the patterned dielectric layer, the C4 pad being in direct electrical contact with the surface of the via.

2. The method of claim 1, further comprising:
   forming a buffer layer adjacent to and on a first portion of the C4 pad; and
   forming a C4 bump on a second portion of the C4 pad.

3. The method of claim 1, further comprising, after the exposing of the surface of the via but before the forming of the self-assembling BCP layer:
   depositing a hardmask on the dielectric layer; and
   creating one or more hardmask openings by selectively removing one or more portions of the hardmask;
   wherein the patterned dielectric layer has the pattern of grooves in an area defined by the one or more hardmask openings and does not have the pattern of grooves outside the area defined by the one or more hardmask openings.

4. The method of claim 1, wherein the self-assembling BCP layer is an undirected self-assembling BCP layer, the undirected self-assembling BCP layer having a random pattern of grooves.

5. The method of claim 1, wherein the self-assembling BCP layer is a directed self-assembling BCP layer, the directed self-assembling BCP layer having an ordered pattern of grooves.

6. The method of claim 1, wherein the grooves of the patterned dielectric layer provide an interfacial surface area between the patterned dielectric layer and the C4 pad sufficient to inhibit the C4 pad from delaminating during thermal expansion or contraction, thereby maintaining the electrical contact between the C4 pad and the via.

7. A method comprising:
   forming a self-assembling block copolymer (BCP) layer on a backside of a semiconductor substrate having a via extending there through to a front side back end of line (BEOL) layer, the via having a conformal liner layer thereon, the self-assembling BCP layer having a pattern of grooves therein, the grooves extending from a first surface of the self-assembling BCP layer to a second, opposing surface of the self-assembling BCP layer;
   patterning the semiconductor substrate by etching the semiconductor substrate using the self-assembling BCP layer having the pattern of grooves therein as a mask, the patterned semiconductor substrate having the pattern of grooves therein;
   removing the self-assembling BCP layer;
   forming a dielectric layer on the patterned semiconductor substrate by depositing a dielectric material on the patterned semiconductor substrate and within the grooves of the patterned semiconductor substrate;
   exposing a surface of the via by removing a portion of the dielectric layer and a portion of the conformal liner layer; and
   forming a controlled collapse chip connection (C4) pad by depositing a conductive material on the dielectric layer, the C4 pad being in direct electrical contact with the surface of the via.

8. The method of claim 7, further comprising:
   forming a buffer layer adjacent to and on a first portion of the C4 pad; and
   forming a C4 bump on a second portion of the C4 pad.

9. The method of claim 7, further comprising, before the forming of the self-assembling BCP layer:
   depositing a hardmask on the backside of the semiconductor substrate; and
   creating one or more hardmask openings by selectively removing one or more portions of the hardmask;
   wherein the patterned semiconductor substrate has the pattern of grooves in an area defined by the one or more hardmask openings and does not have the pattern of grooves outside the area defined by the one or more hardmask openings.

10. The method of claim 7, wherein the self-assembling BCP layer is an undirected self-assembling BCP layer, the undirected self-assembling BCP layer having a random pattern of grooves.

11. The method of claim 7, wherein the self-assembling BCP layer is a directed self-assembling BCP layer, the directed self-assembling BCP layer having an ordered pattern of grooves.

12. The method of claim 7, further comprising, between the exposing of the surface of the via and the forming of the C4 pad:
   forming a self-assembling block copolymer (BCP) layer on the dielectric layer and the surface of the via, the self-assembling BCP layer having a pattern of grooves therein, the grooves extending from a third surface of the self-assembling BCP layer to a fourth, opposing surface of the self-assembling BCP layer;
   patterning the dielectric layer by etching the dielectric layer using the self-assembling BCP layer having the pattern of grooves therein as a mask, the patterned dielectric layer having the pattern of grooves therein; and
   removing the self-assembling BCP layer.

13. The method of claim 12, further comprising, after the exposing of the surface of the via but before the forming of the self-assembling BCP layer:
   depositing a hardmask on the dielectric layer; and
   creating one or more hardmask openings by selectively removing one or more portions of the hardmask;
   wherein the patterned dielectric layer has the pattern of grooves in an area defined by the one or more hardmask openings and does not have the pattern of grooves outside the area defined by the one or more hardmask openings.

14. The method of claim 12, wherein the grooves of the patterned dielectric layer provide an interfacial surface area between the patterned dielectric layer and the C4 pad sufficient to inhibit the C4 pad from delaminating during thermal expansion or contraction, thereby maintaining the electrical contact between the C4 pad and the via structure.

* * * * *